United States Patent [19]

Saeki et al.

[11] Patent Number: 5,214,327
[45] Date of Patent: May 25, 1993

[54] PROGRAMMABLE LOGIC DEVICE AND STORAGE CIRCUIT USED THEREWITH

[75] Inventors: Yukihiro Saeki; Tomohisa Shigematsu, both of Yokohama, Japan

[73] Assignee: Kabushiki Kaisha Toshiba, Kawasaki, Japan

[21] Appl. No.: 577,653

[22] Filed: Sep. 4, 1990

[30] Foreign Application Priority Data

Sep. 4, 1989 [JP] Japan .................................. 1-228833

[51] Int. Cl.⁵ ...................... H03K 19/094; G11C 7/00
[52] U.S. Cl. .................... 307/465; 307/296.1; 307/291; 365/226; 365/156
[58] Field of Search ............ 307/465, 289, 291, 296.1; 365/226, 154, 156

[56] References Cited

U.S. PATENT DOCUMENTS

| | | | |
|---|---|---|---|
| 3,813,653 | 5/1974 | Smith et al. | |
| 4,042,841 | 8/1977 | Hills et al. | 307/296.1 |
| 4,063,117 | 12/1977 | Laugesen et al. | 307/278 |
| 4,368,524 | 1/1983 | Nakamura et al. | 365/226 |
| 4,511,811 | 4/1985 | Gupta | 307/463 |
| 4,642,487 | 2/1987 | Carter et al. | 307/242 |
| 4,694,430 | 9/1987 | Rosier | 365/226 |
| 4,695,740 | 9/1987 | Carter et al. | 307/465 |
| 4,706,216 | 11/1987 | Carter | 365/94 |
| 4,722,075 | 1/1988 | Kaszubinski et al. | 365/226 |
| 4,750,155 | 6/1988 | Hsieh | 365/203 |
| 4,876,466 | 10/1989 | Kondou et al. | 307/465 |
| 4,901,284 | 2/1990 | Ochii et al. | 365/226 |
| 5,021,680 | 6/1991 | Zaw Win et al. | 307/465 |
| 5,027,003 | 6/1991 | Haight et al. | 307/465 |
| 5,051,958 | 9/1991 | Arakawa | 365/226 |

FOREIGN PATENT DOCUMENTS 0330628  8/1989  European Pat. Off. .

OTHER PUBLICATIONS

8080 Wescon 86/Conference Record 30 (1986) Nov. 18-20, Los Angeles, Calif. USA, "A Programmable Logic Device Based on Static Memory," by David P. Lautzenheiser.

Primary Examiner—Edward P. Westin
Assistant Examiner—Richard Roseen
Attorney, Agent, or Firm—Finnegan, Henderson, Farabow, Garrett and Dunner

[57] ABSTRACT

A programmable logic device comprises a data storage circuit for storing 1-bit control data and a MOS transistor which is switch controlled in accordance with stored data in the data storage circuit. When the MOS transistor is switch controlled, the power supply voltage of the data storage circuit is raised. Two signal lines are connected with each other through the MOS transistor which has been rendered conductive, thereby permitting a signal to be transmitted between the signal lines.

16 Claims, 8 Drawing Sheets

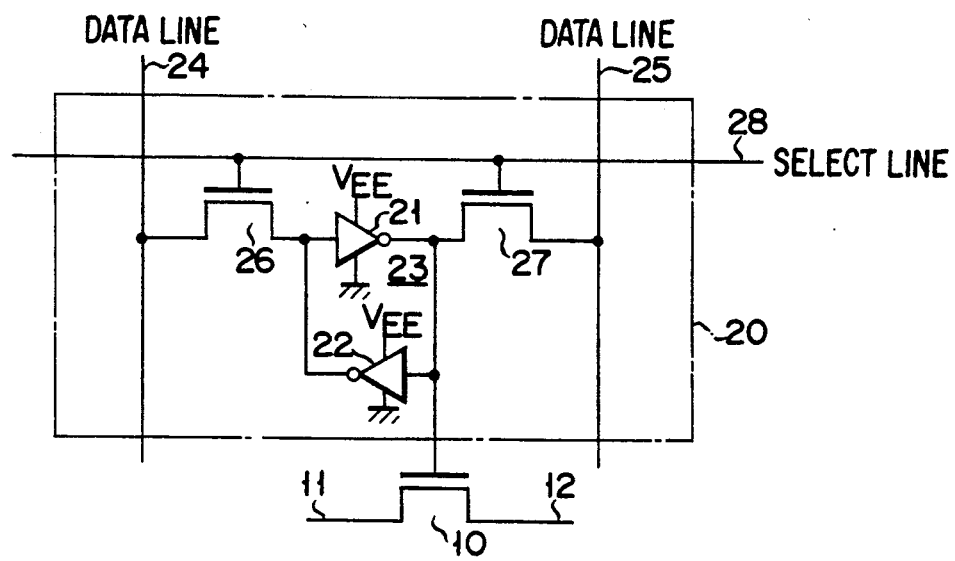
F I G. 2
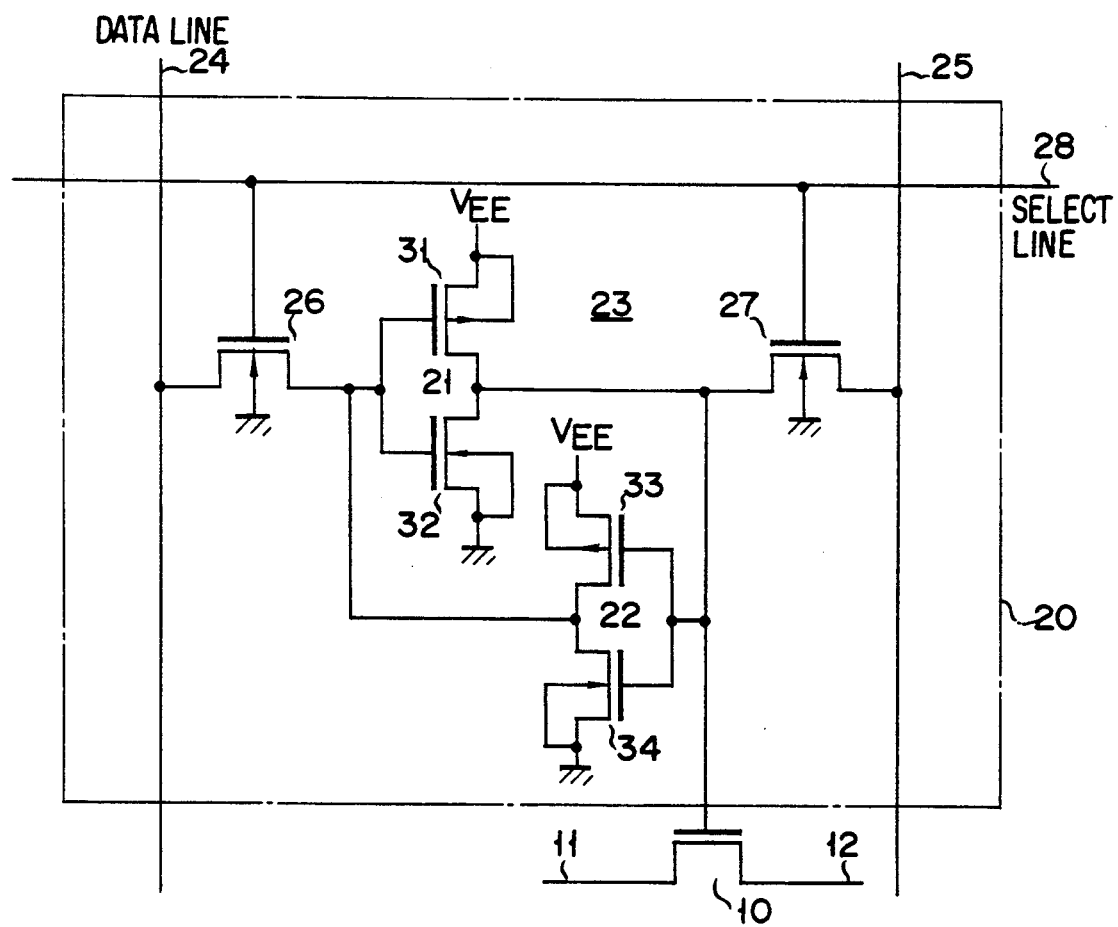
F I G. 3

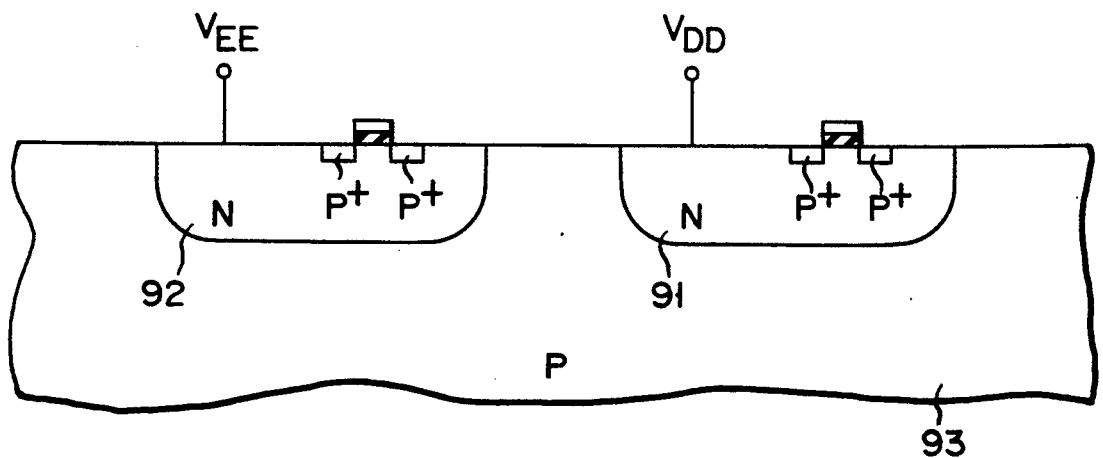
F I G. 4
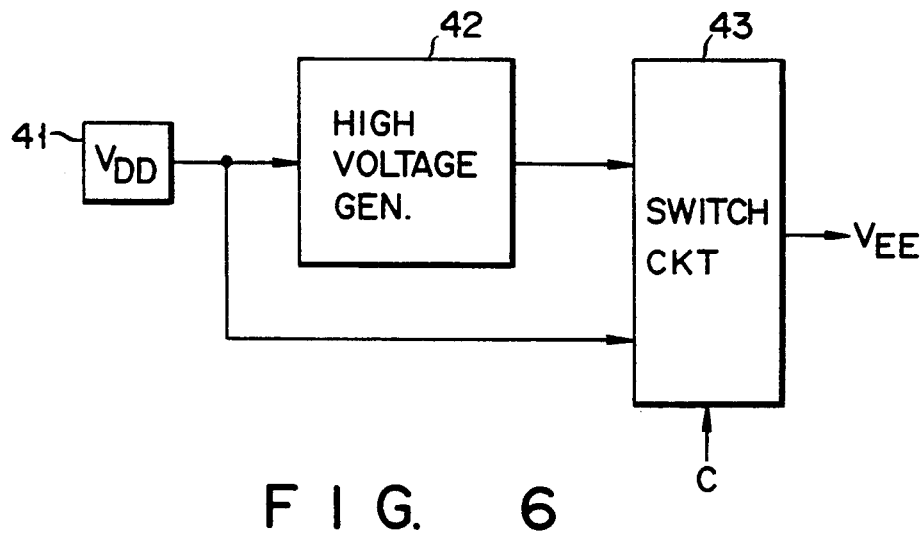
F I G. 6
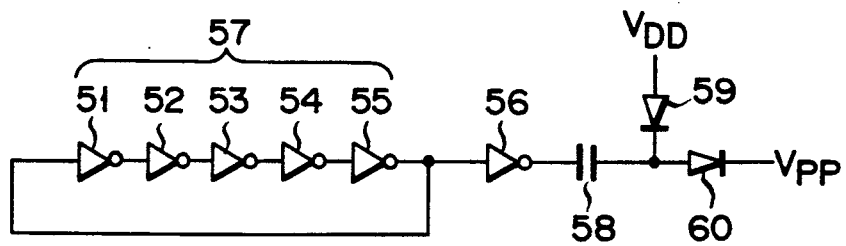
F I G. 7

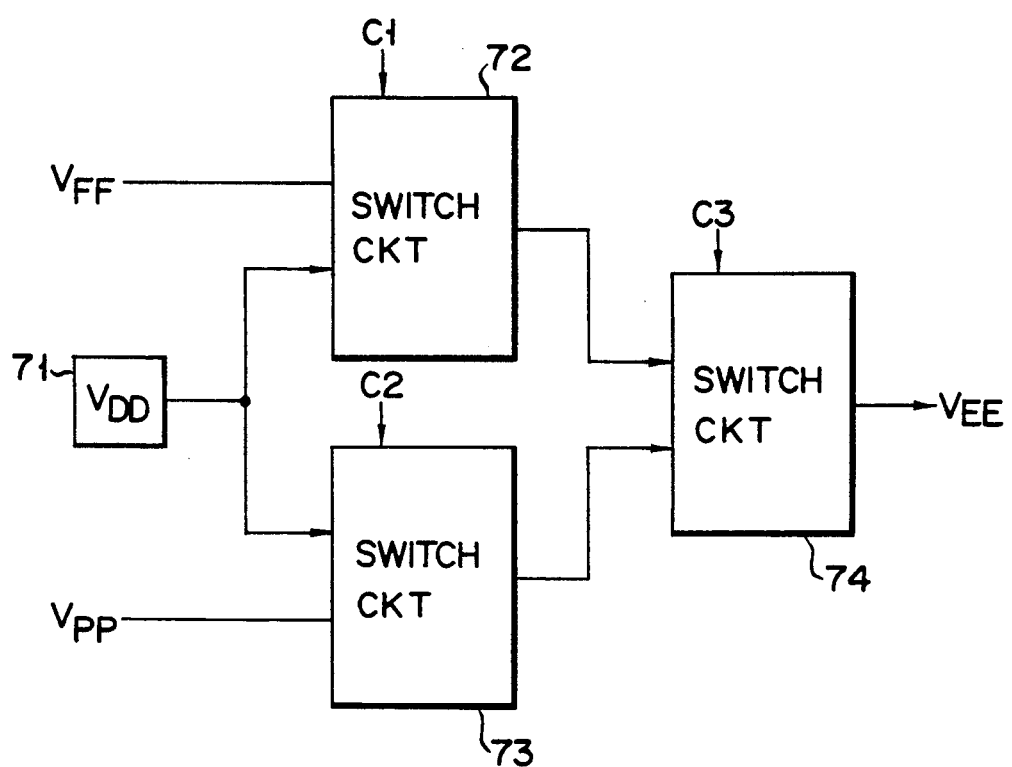
F I G. 12

PROGRAMMABLE LOGIC DEVICE AND STORAGE CIRCUIT USED THEREWITH

BACKGROUND OF THE INVENTION

1. Field of the Invention

The present invention relates to a programmable logic device having programmable switching means and a storage circuit used with the logic device.

2. Description of the Related Art

Integrated circuits in which logic gates can be programmed by a user have come into general use in recent years. Such integrated circuits are generally referred to as programmable logic devices (abbreviated to PLDs). A feature of the PLD is incorporation therein of a large number of active devices or passive devices which substantially operate a switches. Selective switching (on or off) of those switch devices permits a desired logical function to be implemented.

One of prior arts of the PLDs uses CMOS transmission gates, as disclosed in U.S. Pat. No. 4,695,740 issued to William S. Carter. As illustrated in FIG. 1, this prior art is comprised of four CMOS transmission gates 81 to 84, a flip-flop 85 for storing control data to selectively switch the CMOS transmission gates on and a buffer 86. Each of the CMOS transmission gate's comprises a P-channel MOS transistor and an N-channel MOS transistor whose drain-to-source paths are paralleled with each other and gates are each connected to selectively receive one of complementary outputs Q and $\bar{Q}$ of the flip-flop 85.

When, in this circuit, the flip-flop 85 is programmed previously such that Q=1 and $\bar{Q}$=0, the transmission gates 81 and 82 are on, while the transmission gates 83 and 84 are off with the result that a signal is transferred from node A through buffer 86 to node B. Conversely, when Q=0 and $\bar{Q}$=1, the transmission gates 83 and 84 are on, while the transmission gates 81 and 82 are off with the result that a signal is transferred from node B through buffer 86 to node A. In this way, the direction of transmission of a signal in this PLD is determined by data stored in the flip-flop.

The use of a CMOS transmission gate as a switching device as in the conventional PLD requires two transistors for a switching device. This will make circuit configuration complex and wiring for distributing control signals to the gates of transistors troublesome as compared with a switching device consisting of only one N-channel MOS transistor. Moreover, a two-transistor switching device will require an area on an integrated-circuit chip which is at least two times larger than that required for a switching device consisting of a single MOS transistor. This will result in poor integration density and thus a PLD with a large number of switch devices will require a very large chip area. As is well known, an increase in chip area decreases the number of chips per wafer and moreover reduces manufacturing yielding, thus leading to an increase in cost. In addition, an integrated circuit with a large chip area also requires a large package. This will decrease the number of integrated circuits to be mounted on a printed circuit board and further increase cost.

When the switch device is constructed from a single N-channel MOS transistor, on the other hand, a new problem differing from the above will arise. This arises from the well-known inherent characteristic of N-channel MOS transistors, i.e., the back gate bias effect. That is, to turn an N-channel MOS transistor on, its gate is set at a high supply voltage, for example, $V_{DD}$. In this state, however, it is impossible to transmit a signal level in the neighborhood of $V_{DD}$. As is well known, the N-channel MOS transistor cannot be turned on unless its gate potential is higher than its source potential by its threshold voltage (Vth). Thus, when the gate potential is $V_{DD}$, the maximum potential that can be transmitted is as low as ($V_{DD}$−Vth). Moreover, with the output potential in the neighborhood of ($V_{DD}$−Vth), even if the N-channel MOS transistor is in the on state, its on resistance is noticeably high and thus high-speed operation cannot be expected. This will narrow the operating supply voltage range, decrease reliability and involve difficulties in implementing a programmable logic device.

SUMMARY OF THE INVENTION

It is therefore an object of the present invention to provide a programmable logic device and a storage circuit used therein which are high in integration density and reliability and permit high-speed operation.

According to the present invention, there is provided a programmable logic device comprising: data storage means for storing 1-bit control data; at least one data line for transmitting data to be stored in said data storage means; a select line for transmitting a select signal for selecting said data storage means; MOS-type switch means responsive to the stored data in said data storage means to be switch controlled; two signal lines coupled to each other through said MOS-type switch means; and potential amplitude enlarging means for making the potential amplitude of data stored in said data storage means larger than the potential amplitude of a signal transmitted over said two signal lines.

According to the present invention, there is further provided a storage circuit comprising: data storage means for storing data at a first and a second level in a pair; a data line for transmitting data to be written into said data storage means; a select line for transmitting a select signal to select said data storage means; and power supply means for supplying a supply voltage having a magnitude smaller than a potential amplitude of data or a signal transmitted over said data line and said select line in writing the data at said first level into said data storage means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a circuit diagram of a basic cell of a programmable logic device according to a first embodiment of the present invention;

FIG. 3 is a detailed circuit diagram of the basic cell of FIG. 2;

FIG. 4 is a sectional view of the structure of part of the basic cell when it is integrated;

FIG. 6 is a circuit diagram of a power switching circuit used in the first and second embodiments;

FIG. 7 is a circuit diagram of a high voltage generating circuit used in the first and second embodiments;

FIG. 12 is a circuit diagram of a power switching circuit used in the third and fourth embodiments.

DETAILED DESCRIPTION OF THE PREFERRED EMBODIMENTS

Figure 1:
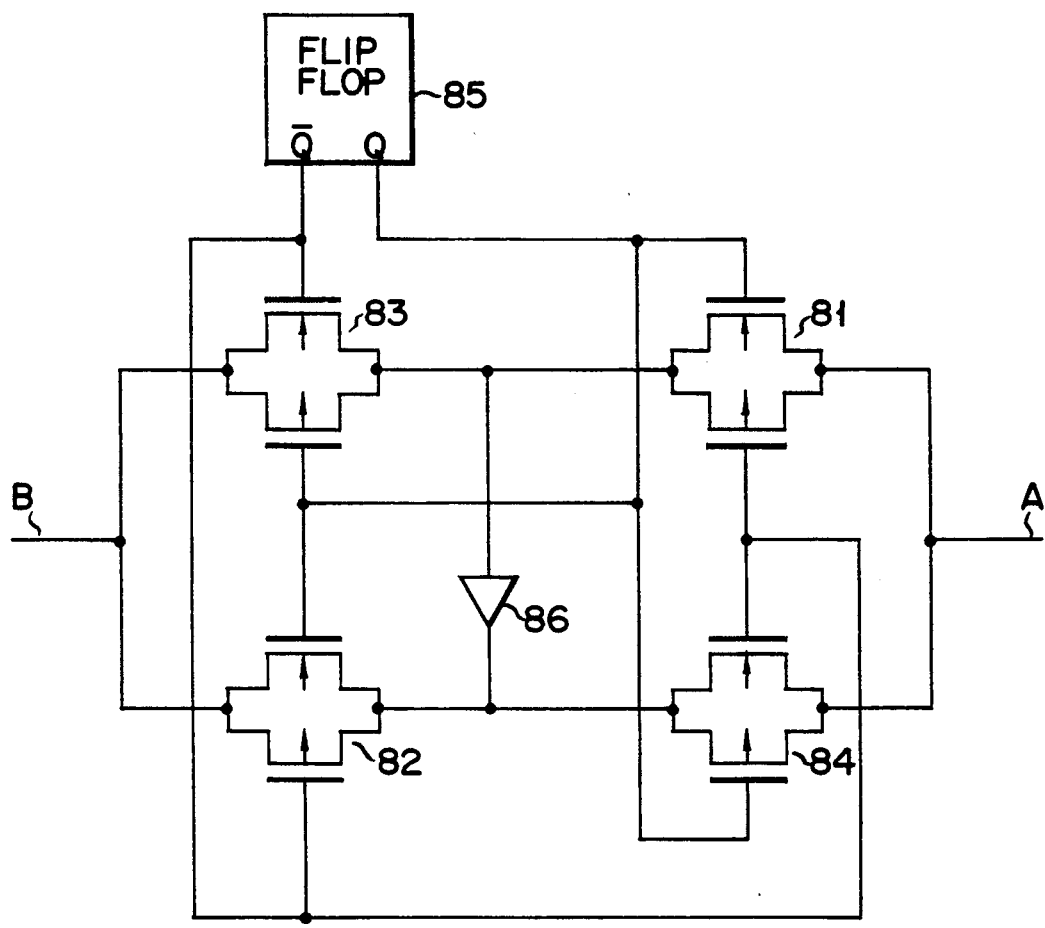
FIG. 1 is a circuit diagram of a prior art PLD.

FIG. 2 illustrates an arrangement of a basic cell which is the minimum unit of a programmable logic device according to a first embodiment of the present invention. The basic cell is comprised of an N-channel switching MOS transistor 10 and a data storage circuit 20 for storing 1-bit control data used to turn the transistor 10 on and off. The transistor 10 and the data storage circuit 20 are fabricated on an integrated-circuit chip.

The source and drain of the transistor 10 are connected to signal lines 11 and 12, respectively. The gate of the transistor 10 is supplied with the stored data in the data storage circuit 20. Between the signal lines 11 and 12 is transmitted a signal having logic levels 1 and 0 which correspond to the supply voltages $V_{DD}$ and 0 (ground potential), respectively.

The data storage circuit 20 is provided with a flip-flop 23 having two inverters 21 and 22 which are cross-coupled. To write data into the flip-flop 23, two data lines 24 and 25 are connected to the flip-flop 23 via N-channel MOS transistors 26 and 27, respectively. The gates of the transistors 26 and 27 are connected to a select line 28 in common. An output signal of the inverter 21 of the flip-flop 23 is applied to the gate of the switching transistor 10 as stored data.

The basic cell with such a structure is similar to one used as a storage cell of a well-known random access memory (RAM). With the former, however, the supply voltage for the flip-flop 23 composed cf two inverters 21 and 22 is not usual $V_{DD}$ but $V_{EE}$ unlike the latter. The supply voltage $V_{EE}$ will be described later.

Next, the operation of the above cell will be described. The operation to write desired control data into the data storage circuit 20 will be described first. To turn the switching transistor 10 on, data at logic 0 and logic 1 are applied to the data lines 24 and 25, respectively. The data at logic 1 corresponds to the supply voltage $V_{DD}$, while the data at logic 0 corresponds to ground potential. By raising the select line 28 to logic 1 in this state, the MOS transistors 26 and 27 are turned on, thereby selecting the cell and transmitting the data on the data lines 24 and 25 to the flip-flop 23. At this point, the supply voltage $V_{EE}$ for the flip-flop 23 is usual $V_{DD}$. Thus, data at logic 1 is written into the flip-flop 23 as is the case with the conventional RAM storage cell. More specifically data is written into the flip-flop 23 such that the output of the inverter 21 is at logic 1 and the output of the inverter 22 is at logic 0.

On the other hand, when the data lines 24 and 25 are set to logic 1 and logic 0, respectively, and the select line 28 is set to logic 1, data at logic 0 will be written into the flip-flop 23. In this case as well, the supply voltage $V_{EE}$ for the flip-flop 23 is set to the usual $V_{DD}$.

When the data write operation is terminated, the select line 28 is set to logic 0. Thereby, the select transistors 26 and 27 are turned off. In this case, the stored data in the flip-flop 23 is always held during the interval when the supply voltage $V_{DD}$ is supplied, regardless of data on the data lines 24 and 25.

Next, the supply voltage $V_{EE}$ is set to a voltage $V_{PP}$ higher than $V_{DD}$. With the supply voltage for the flip-flop 23 thus raised, when the flip-flop 23 stores data at logic 1, the output voltage of the inverter 21 is raised from $V_{DD}$ to $V_{PP}$. As a result, the switching transistor 10 is rendered fully conductive, making its on resistance fully low. Therefore, signal transmission is effected between the signal lines 11 and 12 without a decrease in the $V_{DD}$ level.

When the stored data of the flip-flop 23 is 0, on the other hand, the 0 level potential of the inverter 22 remains ground potential. In this case, therefore, the switching transistor 10 is in the off state so that the signal lines 11 and 12 are electrically disconnected from each other.

According to the present embodiment, there is provided a PLL basic cell which uses only one MOS transistor for a switch. Moreover, even if the signal lines 11 and 12 are at a potential in the neighborhood of $V_{DD}$, the signal potential can be transmitted without any decrease of its level, and high speed operation is permitted. As a result, a PLD can be realized which has a wide operating supply voltage range and improved reliability and is fast in operating speed.

FIG. 3 is a detailed circuit diagram of the basis cell of FIG. 2 in which each of the inverters 21 and 22 in the flip-flop 23 is implemented with a CMOS inverter. The inverter 21 is composed of a P-channel MOS transistor 31 and an N-channel MOS transistor 32, and the inverter 22 is composed of a P-channel MOS transistor 33 and an N-channel MOS transistor 34. The sources of the P-channel MOS transistors 31 and 33 are supplied with the supply voltage $V_{EE}$. The substrates (back gates) of the transistors 31 and 33 are also supplied with the supply voltage $V_{EE}$. The drains of the MOS transistors 31 and 33 are connected to the drains of the N-channel MOS transistors 32 and 34, respectively. The MOS transistors 32 and 34 have their sources connected with ground potential. The substrates (back gates) of the MOS transistors 32 and 34 are also supplied with ground potential. The MOS transistors 31 and 32 have their gates connected together for use as the input of the inverter 21. Similarly the MOS transistors 33 and 34 have their gates connected together for use as the input of the other inverter 22. The substrates of the select MOS transistors 26 and 27 are also supplied with ground potential.

The feature of the basic cell constructed as described above is that the sources and substrates of the P-channel MOS transistors 31 and 33 in the CMOS inverters 21 and 22 are connected to the $V_{EE}$ node. This implies that, in the CMOS process using N wells, an N-well region for the $V_{DD}$ and an N-well region for the $V_{EE}$ are fabricated together on the same P-type semiconductor substrate. More specifically, as illustrated in FIG. 4, an N well region 91 in which is formed a P-channel MOS transistor forming a circuit connected to the signal lines 11 and 12 is biased to $V_{DD}$, while an N well region 92, in which the P-channel MOS transistors 31, 33, etc., forming the data storage circuit 20 for controlling the switching MOS transistor 10 are formed, is biased to $V_{EE}$. Reference numeral 93 designates a P-type semiconductor substrate.

Where a large number of switching MOS transistors 10 are integrated, their control circuits, i.e., data storage circuits 20 and hence control signal lines increase in number. For this reason, some device is needed in integrating many switching MOS transistors 10 and data storage circuits 20.

Figure 5:
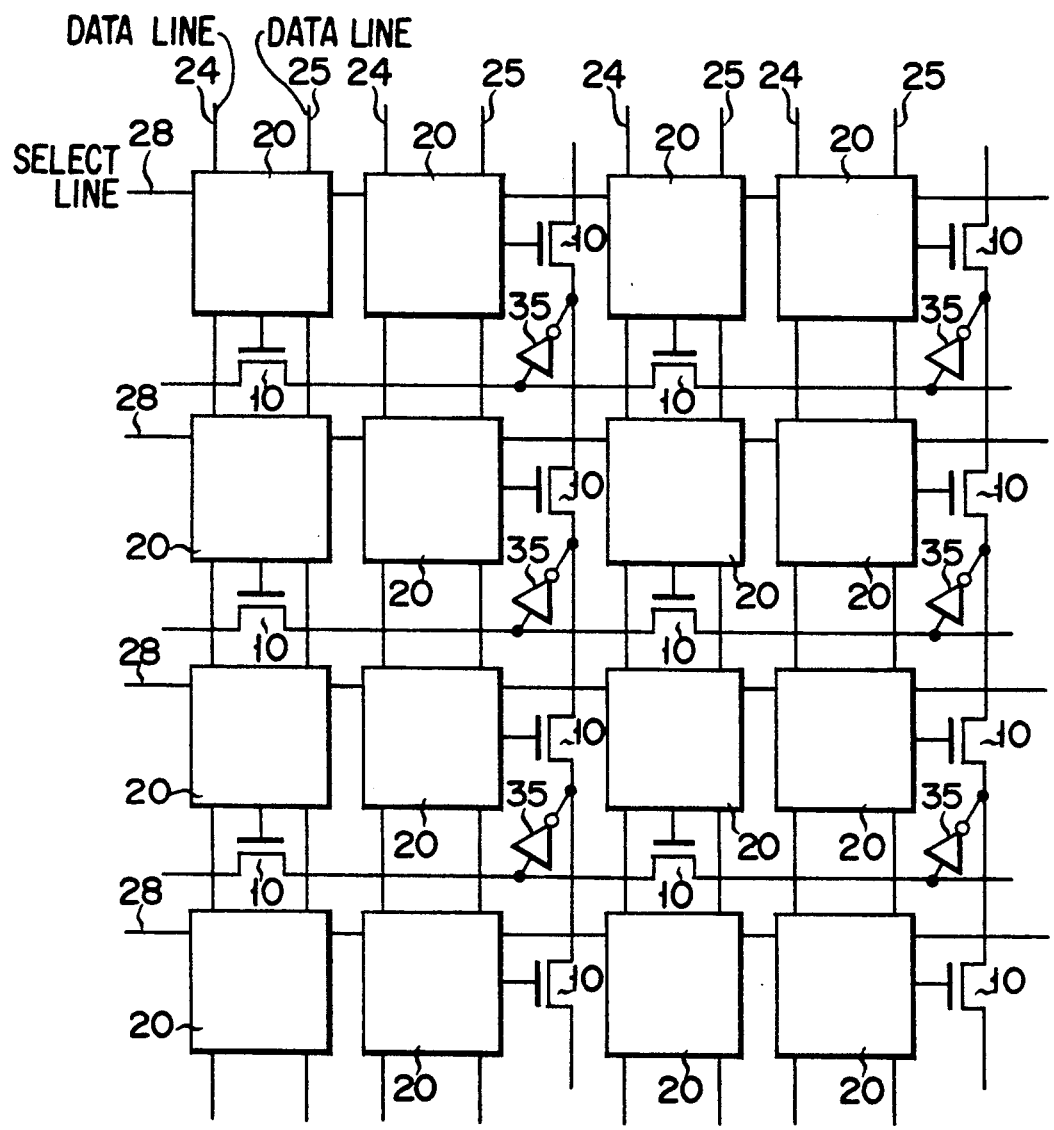
FIG. 5 is a circuit diagram of a programmable logic array according to a second embodiment of the present invention in which a large number of basic cells of FIG. 2 are integrated.

FIG. 5 illustrates a PLD device in which a large number of basic cells are integrated. In integrating a large number of basic cells, a large number of data storage circuits 20 can be arrayed in a matrix to share the data lines 24 and 25 and the select line 28 among a plurality of data storage circuits 20, thereby decreasing the number of control signal lines. That is, the data lines 24 and 25 are made common to a plurality of basic cells arrayed vertically, while the select line 28 is made common to a plurality of basic cells arrayed horizontally as shown. The switching MOS transistor 10 is connected in series with other switching MOS transistors 10 by the signal lines 11 and 12 (not shown in FIG. 5). Inverters 35 are each interposed between signal lines to determine the direction of a signal.

In the above embodiment, the supply voltage $V_{EE}$ may be supplied from the outside of an integrated-circuit chip. In this case, however, the number of pins of the chip increases and hence it is not desirable. For this reason, it may be devised to construct a circuit for generating the supply voltage $V_{EE}$ within the integrated-circuit chip.

Next, the integration of a circuit for generating the supply voltage $V_{EE}$ which is used with each of the circuits or devices of FIG. 1, FIG. 3 and FIG. 5 into an integrated-circuit chip will be described below.

FIG. 6 illustrates a supply voltage switching circuit for generating the supply voltage $V_{PP}$ from the usual supply voltage $V_{DD}$ and switching the output supply voltage $V_{EE}$ between $V_{PP}$ and $V_{DD}$. In the Figure, a terminal 41 is externally supplied with the usual supply voltage $V_{DD}$, which is, in turn, applied to a high voltage generating circuit 42 and a switching circuit 43. The high voltage generating circuit 42 raises the supply voltage $V_{DD}$ to generate the high voltage $V_{PP}$, which is, in turn, applied to the switching circuit 43. The switching circuit 43 is responsive to a control signal C which is input from the outside of the integrated-circuit chip or generated within the chip to switch the output voltage $V_{EE}$ between $V_{DD}$ and $V_{PP}$.

FIG. 7 illustrates a specific arrangement of the high voltage generating circuit 42 of FIG. 6. Inverters 51 to 56 are always powered from the voltage $V_{DD}$, and the inverters 51 to 55 constitute a ring oscillator 57. The output of the ring oscillator 57 is applied to one electrode of a capacitor 58. To the other electrode of the capacitor 58 is applied the usual supply voltage $V_{DD}$ via a diode 59 in the forward direction. The other electrode of the capacitor 58 is connected to the anode of a diode 60.

Such a circuit is well known as a charge pump circuit. After the lapse of a predetermined time from when the ring oscillator 57 starts its oscillation, the voltage $V_{PP}$ which is higher than $V_{DD}$ is obtained at the cathode of the diode 60.

Figure 8:
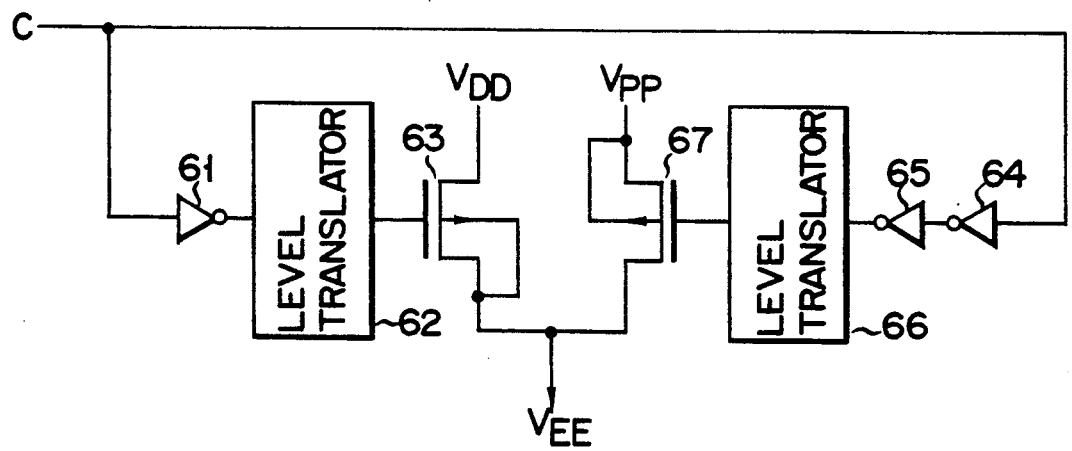
FIG. 8 is a detailed circuit diagram of the switching circuit of FIG. 6.

FIG. 8 illustrates a specific arrangement of the switching circuit 43 of FIG. 6. The control signal C is at logic 1 when data is written into the data storage circuit 20 (refer to FIG. 2) and during an interval when the data is stored and goes to logic 0 when the switching MOS transistor (shown in FIG. 2) is turned on or off according to the stored data. The control signal C is applied to the gate of a P-channel MOS transistor 63 via an inverter 61 and a level translator circuit 62. The control signal C is also applied to the gate of a P-channel MOS transistor 67 via inverters 64 and 65 and a level translator circuit 66. The level translator circuits 62 and 66 are used to translate a logical amplitude between $V_{DD}$ and ground potential to a logical amplitude between $V_{PP}$ and ground potential. The MOS transistor 63 has its source connected to the $V_{DD}$ node and its substrate (back gate) connected to its drain. The MOS transistor 67 has its source and substrate connected together to the $V_{PP}$ node. The drains of the MOS transistors 63 and 67 are connected together to output the supply voltage $V_{EE}$.

With the switching circuit 43, when the control signal C is at logic 1, the MOS transistor 63 is on, while the MOS transistor 67 is off. At this time, the voltage $V_{DD}$ is output as the voltage $V_{EE}$. When the control signal C is at logic 0, on the other hand, the MOS transistor 67 is on, while the MOS transistor 63 is off. At this point, the high voltage $V_{PP}$ is output as the voltage $V_{EE}$.

Figure 9:
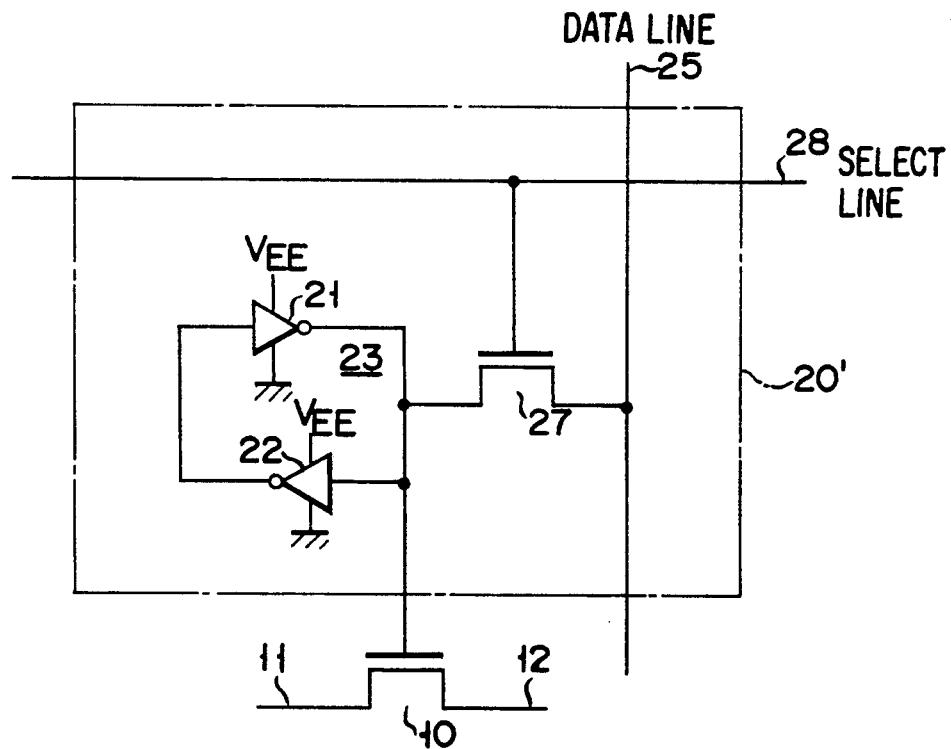
FIG. 9 is a circuit diagram of a basic cell according to a third embodiment of the present invention.

FIG. 9 illustrates a PLD basic cell according to a third embodiment of the present invention. This basic cell is composed of a switching N-channel MOS transistor 10 having its source and drain connected to signal lines 11 and 12, respectively, and a data storage circuit 20' which stores 1-bit control data used to switch the MOS transistor 10. The transistor 10 and the data storage circuit 20' are constructed on an integrated-circuit chip.

The data storage circuit 20' saves the write data line 24 and the select N-channel MOS transistor 26 from the data storage circuit 20 of the basic cell of FIG. 2. The basic cell is also distinct from a memory cell circuit of a RAM in that the supply voltage supplied to the inverters 21 and 22 of the flip-flop 23 is not $V_{DD}$ but $V_{EE}$.

With the basic cell constructed as above, if the inverters 21 and 22 forming the flip-flop 23 were operated with the usual supply voltage $V_{DD}$ in writing data, false writing would occur. For example, suppose now that the output of the inverter 21 is at logic 0 before writing operation is performed. At this point, the select line 28 is at logic 0 and hence the cell is in the data stored state. To write "1" into the flip-flop 23 in this state, data at logic 1 is applied to the data line 25. Next, the select line 28 is set at logic 1 to turn the MOS transistor 27 on. Then, a 0 from the inverter 21 and a 1 on the data line 25 will collide with each other so that the voltage level of the output of the inverter 21 goes to an intermediate level between 0 and 1 levels. Unless the intermediate level exceeds the threshold of the inverter 22, the output level of the inverter 22 cannot be inverted so that it remains at logic 1. In conclusion, the stored data of the flip-flop 23 remains at logic 0 though write data at logic 1 has been applied. This means that the writing of a 1 has been not accomplished. Such a situation can actually occur. This is due to the fact that an N-channel MOS transistor has difficulty passing 1-level data therethrough because of its back gate bias effect. According to the back gate bias effect, as is well known, the on resistance of the MOS transistor 27 increases as the potential at the data line 25 becomes high, and the transistor 27 will be cut off when the potential at the data line 25 exceeds $V_{DD}-V_{th}$. Vth represents the threshold voltage of an N-channel MOS transistor. Therefore, there is an upper limit on the output voltage of the inverter 21 in the case where it outputs a 0. In case where the upper limit is not sufficiently high, poor writing will result. Since the on resistance of the MOS transistor 27 is sufficiently low in the case of the writing of a 0, on the other hand, the output voltage of the inverter 21 can be made lower than the threshold of the inverter 22 even if the inverter 21 is providing a 1-level output. Thus, the writing of a 0 can be accomplished normally.

The basic cell is therefore arranged to avoid the occurrence of such poor writing as described above by varying the supply voltage $V_{EE}$ for the two inverters 21 and 22 of the flip-flop 23. Moreover, even when the voltage levels of the two signal lines 11 and 12 are in the neighborhood of $V_{DD}$, the transmission of a signal can be made without decreasing the voltage levels as is the case with the basic cell of FIG. 2.

Next, the operation of the basic cell according to the third embodiment will be described.

First, data at a 1 level is written into the flip-flop 23 so that it is initialized. That is, data at a 1 level is applied to the data line 25 as in the above case. The 1 level of data corresponds to the supply voltage $V_{DD}$ as in the above case. When a signal at a 1 level is applied to the select line 28 in this state, the select MOS transistor 27 is turned on so that the data storage circuit associated therewith is selected and data on the data line 25 is transferred to the flip-flop 23. At this point, the supply voltage $V_{EE}$ to the flip-flop 23 is set at a $V_{FF}$ level lower than the usual $V_{DD}$ level. The $V_{FF}$ level is set such that the potential divided by the on resistance of the inverter 21 when it provides a 0-level output and the sum of the on resistance of the MOS transistor 27 when data at a 1 level passes therethrough and the on resistance of a buffer circuit not shown for driving the data line 25 exceeds the circuit threshold of the inverter 22. Whereby, the output of the inverter 21 whose supply voltage is $V_{FF}$ goes to a 1 level and moreover the 1 level corresponds to the $V_{FF}$ level.

Next, the select line 28 is supplied with a signal at a 0 level. Consequently, the select MOS transistor 27 is turned off and the stored data of the flip-flop 23 is always held at a 1 level irrespective of data on the data line 25. Next, the supply voltage $V_{EE}$ for the two inverters 21 and 22 of the flip-flop 23 is raised from $V_{FF}$ to the usual $V_{DD}$. As a result, the 1-level output voltage of the inverter 21 is raised from $V_{FF}$ to $V_{DD}$. Whereby, the initialization is terminated and 1-level data is stored in the flip-flop 23.

To store data at a 0 level in the flip-flop 23 afterward, data at a 0 level is applied to the data line 25 and then a signal at a 1 level is applied to the select line 28. At this point, the supply voltage $V_{EE}$ for the inverters 21 and 22 may be either $V_{FF}$ or $V_{DD}$. This is because the writing of a 0 can be performed easily as described above.

After the initialization or the writing of a 0, the supply voltage $V_{EE}$ is set to $V_{PP}$ higher than $V_{DD}$. When the supply voltage of the flip-flop 23 is thus raised, the 1-level potential of the inverter 22 also rises from $V_{DD}$ to $V_{PP}$. As a result, the switching MOS transistor 10 supplied with the stored data of the flip-flop 23 is rendered fully conductive so that its on resistance becomes fully low. Thus, signal transmission can be made between the signal lines 11 and 12 without decreasing the $V_{DD}$ level.

When the stored data of the flip-flop 23 is a 0, on the other hand, the 0 level potential of the inverter 22 remains ground voltage so that the switching MOS transistor 10 is in the off state and the signal lines 11 and 12 are disconnected from each other.

As can be seen from the foregoing, the basic cell permits a programmable logic device using a single MOS transistor as a switch to be implemented. In addition, even the voltage levels of the signal lines 11 and 12 which are in the neighborhood of $V_{DD}$ can be transmitted without decreasing their levels and fast operation can be performed.

In the embodiments, the data storage circuit is constructed from a flip-flop using inverters. Any circuit configuration may be used so long as it has the same function. The three supply voltages $V_{DD}$, $V_{FF}$ and $V_{PP}$ may be set to any values so long as they satisfy the relation $V_{DD} < V_{FF} < V_{PP}$. Also, the value of the voltage $V_{EE}$ at the time of the writing of data is not limited to the above relation only but may be selected freely from among the following various relations.

(1) At the time of writing of a 1, the data line 25 is at $V_{DD}$, the select line 28 is at $V_{DD}$ and $V_{EE}$ is $V_{PP}$.

(2) At the time of writing of a 0, the data line 25 is at ground potential, the select line 28 is at $V_{DD}$ and $V_{EE}$ is $V_{FF}$ or $V_{DD}$.

(3) At the time of writing of a 1, the data line 25 is at $V_{PP}$, the select line 28 is at $V_{PP}$ and $V_{EE}$ is $V_{DD}$.

(4) At the time of writing of a 0, the data line 25 is at ground potential, the select line 28 is at $V_{DD}$ and $V_{EE}$ is $V_{DD}$ or $V_{PP}$.

That is, basically, the supply voltage of the data storage circuit has only to be lower than voltage levels on the data line 25 and the select line 28 at the time of writing of a 1. There is no such a limitation at the time of writing of a 0. Thus, if the supply voltage relation at the time of writing of a 1 is maintained, the simultaneous writing of a 1 and a 0 can be accomplished as in a general RAM.

Figure 10:
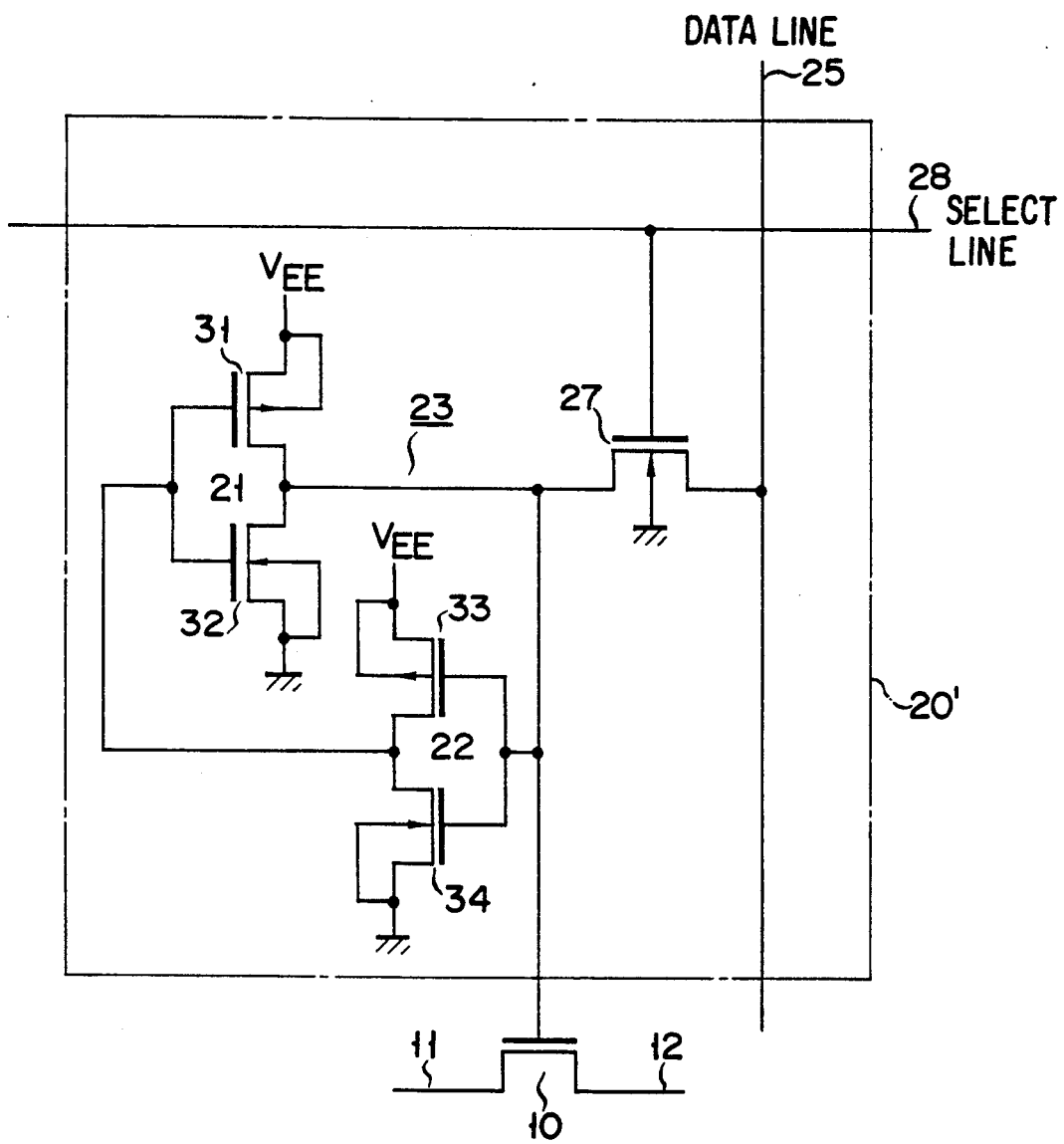
FIG. 10 is a detailed circuit diagram of the basic cell of FIG. 9.

FIG. 10 illustrates a detailed arrangement of the basic cell of FIG. 9 in which the inverters 21 and 22 of the flip-flop 23 are implemented with CMOS inverters. The inverter 21 is composed of complementary MOS transistors 31 and 32 and the inverter 22 is composed of complementary MOS transistors 33 and 34. This basic cell is characterized in that the sources and substrates of the P-channel MOS transistors 31 and 33 are connected to the $V_{EE}$ node. The N-well region of the other circuit (not shown) connected to the signal lines 11 and 12 between which signal transmission is made via the switching MOS transistor 10 is biased to $V_{DD}$, while the N-well region of the data storage circuit 20 for controlling the switching MOS transistor 10 is biased to $V_{EE}$.

Figure 11:
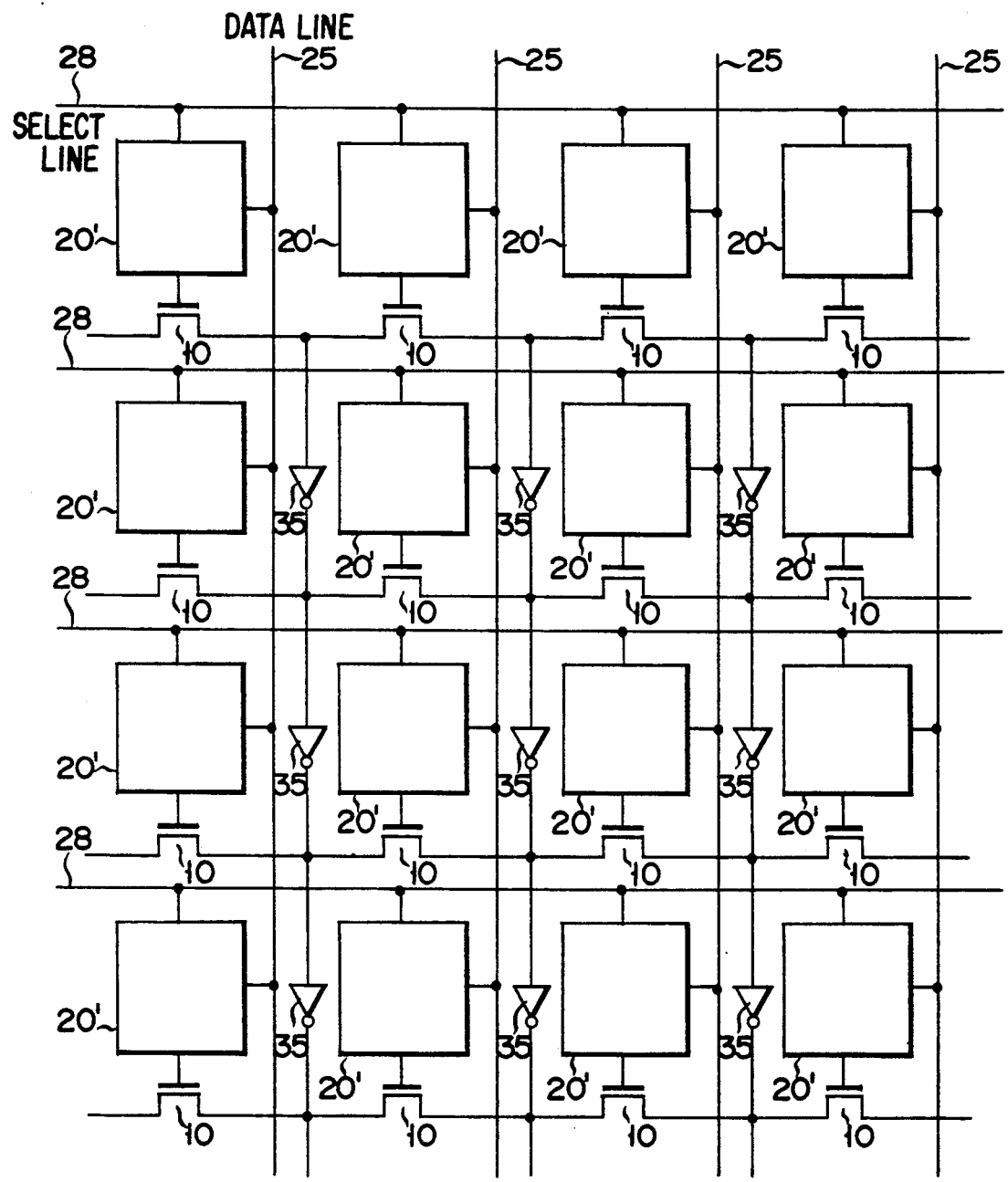
FIG. 11 is a circuit diagram of a programmable logic device according to a fourth embodiment of the present invention in which a large number of basic cells of FIG. 10 are integrated.

FIG. 11 illustrates a PLD according to a fourth embodiment of the present invention in which a large number of basic cells shown in FIG. 10 are integrated. To integrate many basic cells as shown, many data storage circuits 20' are arrayed in a matrix and each of data lines 25 and select lines 28 is shared among a plurality of basic cells, thus permitting control signal lines to decrease in number. A switching MOS transistor 10 is connected in series with other switching MOS transistors 10 through signal lines 11 and 12 (not shown in FIG. 11). Inverters 35 are each interposed between signal lines to determine the direction of signals.

Hereinafter the supply voltage generating circuit used in the basic cells or PLDs according to the third and fourth embodiments will be described.

FIG. 12 illustrates the supply voltage generating circuit which is supplied with the usual supply voltage $V_{DD}$, $V_{FF}$ which is lower than $V_{DD}$ and $V_{PP}$ which is higher than $V_{DD}$ and switches those voltages to provide a desired one. In the Figure, to a terminal 71 is applied the usual supply voltage $V_{DD}$ which is supplied from the outside of the integrated circuit. The supply voltages $V_{FF}$ and $V_{PP}$ may be supplied from the outside of the integrated-circuit chip. In this case, however, the pin terminals of the chip increase in number. It is therefore desired that both the voltages $V_{FF}$ and $V_{PP}$ be generated within the same chip. The voltage $V_{PP}$ can be generated within an integrated-circuit chip by the use of a high voltage generating circuit which may be the same as that shown in FIG. 7. The voltage $V_{FF}$ can easily be obtained by dividing the supply voltage $V_{DD}$ by means of a voltage divider comprised of resistors or MOS transistors used as resistors.

The voltages $V_{FF}$ and $V_{DD}$ are applied to a first switching circuit 72 and the voltages $V_{DD}$ and $V_{PP}$ are applied to a second switching circuit 73. The switching circuits 72 and 73 are responsive to control signals C1 and C2, respectively, to switch their respective output voltages between two input voltages for application to a third switching circuit 74. The third switching circuit 74 is responsive to a control signal C3 to switch the output voltage $V_{EE}$ between two input voltages.

The switching circuits 72, 73 and 74 of FIG. 12 may use the same construction as in FIG. 8.

It will be apparent that the present invention is not limited to the above embodiments and various modifications are possible. For example, although, in the above embodiments, the voltage $V_{EE}$ is generated within an integrated-circuit chip, it may be supplied from the outside of the chip. Where the voltage $V_{EE}$ is supplied from the outside of the integrated-circuit chip, data to turn a switching MOS transistor on and off is stored in the data storage circuit 20 even if the $V_{DD}$ supply voltage is not supplied. For this reason, a standby mode, such as backup of stored data by a battery, can also easily be realized.

According to the present invention, as described above, there is provided a programmable logic device and a storage circuit used therein which are high in integration density and reliability and permit high-speed operation.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A programmable logic device comprising:
   data storage means for storing 1-bit control data;
   at least one data line for transmitting data to be stored in said data storage means;
   a select line for transmitting a select signal for selecting said data storage means;
   MOS-type switch means responsive to the stored data in said data storage means to be switch controlled; two signal lines coupled to each other through said MOS-type switch means; and
   enlarging means for making the potential amplitude of data stored in said data storage means larger than the potential amplitude of a signal transmitted over said two signal lines.

2. A programmable logic device according to claim 1, wherein said enlarging means includes switching means for selectively applying one of a first supply voltage and a second supply voltage to said data storage means, wherein the first supply voltage has a first potential amplitude and the second supply voltage has a potential amplitude higher than the first potential amplitude.

3. A programmable logic device according to claim 2, wherein said enlarging means includes means for raising said first supply voltage to generate said second supply voltage.

4. A programmable logic device according to claim 2, wherein said data storage means includes a CMOS structure having an N type well region coupled to said supply voltage switching means.

5. A programmable logic device according to claim 1, wherein said data storage means comprises two inverters in a cross-coupled configuration.

6. A programmable logic device according to claim 5, wherein each of said two inverters includes a CMOS inverter.

7. A programmable logic device comprising:
   a plurality of programmable logic device cells arranged in a first direction and in a second direction in a matrix configuration, each of said programmable logic device cells including
   data storage means for storing data,
   at least one data input for receiving data to be stored in said data storage means, and
   a select input for receiving a signal for selecting said data storage means;
   MOS-type switch means, switch controlled in accordance with the data stored in said data storage means and coupled to MOS-type switch means of other programmable logic device cells;
   means for interconnecting data inputs of multiple programmable logic device cells in the first direction;
   means for interconnecting select inputs of multiple programmable logic device cells in the second direction; and
   enlarging means for enlarging the potential amplitude of data stored in said data storage means of each of said programmable logic device cells.

8. A programmable logic device according to claim 7, wherein said enlarging means includes means for selectively applying one of a first supply voltage and a second supply voltage to said data storage means, wherein the first supply voltage has a first potential amplitude and the second supply voltage has a potential amplitude higher than the first potential amplitude.

9. A programmable logic device according to claim 8, wherein said enlarging means includes means for raising said first supply voltage to generate said second supply voltage.

10. A programmable logic device according to claim 8, wherein said data storage means includes a CMOS structure having an N type well region coupled to said supply voltage switching means.

11. A programmable logic device according to claim 8, wherein said applying means includes means for applying said first supply voltage when data is written into said data storage means and said second supply voltage when said MOS-type switch means is rendered conductive.

12. A storage circuit comprising:
data storage means for storing data having complementary levels;
a data line for transmitting data having a first potential amplitude to said data storage means;
a select line for transmitting a select signal having a second potential amplitude to select said data storage means; and
power supply means for supplying a supply voltage having a magnitude smaller than the first or second potential amplitudes when writing data into said data storage means.

13. A programmable logic device comprising:
data storage means for storing data having complementary levels;
a data line for transmitting data having a first potential amplitude to said data storage means;
a select line for transmitting a select signal having a second potential amplitude to select said data storage means;
MOS-type switch means responsive to stored data in said data storage means to be switch controlled;
two signal lines coupled by said MOS-type switch means; and
power supply means for supplying to said data storage means a supply voltage having a magnitude smaller than the first or second potential amplitudes when writing data into said data storage means, and supplying to said data storage means a supply voltage having a magnitude larger than the first or second potential amplitudes in switch controlling said MOS type switch means.

14. A programmable logic device comprising:
a plurality of programmable logic device cells arranged in a first direction and in a second direction in a matrix configuration, each of said programmable logic device cells including
data storage means for storing data,
a data line input for receiving data having a first potential amplitude to said data storage means;
a select input for receiving data having a first potential amplitude to said data storage means;
a select input for receiving a signal having a second potential amplitude for selecting said data storage means,
MOS-type switch means, switch controlled in accordance with the data stored in said data storage means and coupled to MOS-type switch means of other programmable logic device cells;
means for interconnecting data inputs of multiple programmable logic device cells in the first direction;
means for interconnecting select inputs of multiple programmable logic device cells in the second direction; and
power supply means provided for said programmable logic device cells, for supplying a supply voltage to said data storage means of each of said programmable logic device cells, said power supply means including
power switching means for supplying a voltage of a magnitude smaller than the first or second potential amplitudes, when writing data into said data storage means of said programmable logic device cells, and for supplying a voltage of a magnitude larger than the first or second potential amplitude, when reading data from said data storage means of said programmable logic device cells.

15. A programmable logic device according to claim 14, wherein said data storage device of each of said programmable logic device cells includes a CMOS structure having an N type well region which is supplied with an output potential of said power switching means.

16. A programmable logic device comprising:
a flip-flop for storing data;
a data line for transmitting data to be stored in said flip-flop;
a select line for transmitting a select signal for selecting said flip-flop;
a select MOS transistor having a source and a drain coupled between said flip-flop and said data line;
MOS-type switching means responsive to the data stored in said flip-flop;
two signal lines mutually coupled through said MOS-type switching means; and
means for enlarging a potential amplitude of the data stored in said flip-flop beyond a potential amplitude of a signal transmitted over said two signal lines, including
means for applying a first voltage to said flip-flop when data is written into said flip-flop, and for applying a second voltage to said flip-flop when said MOS-type switching means is turned on, wherein the first voltage has a first potential amplitude and the second voltage has a potential amplitude higher than the first potential amplitude.

* * * * *